United States Patent
Wang et al.

(10) Patent No.: US 9,557,368 B2
(45) Date of Patent: Jan. 31, 2017

(54) METHOD OF MEASURING THERMAL ELECTRIC CHARACTERISTICS OF SEMICONDUCTOR DEVICE

(75) Inventors: Chien-Ping Wang, Hsinchu (TW); Tzung-Te Chen, Hsinchu (TW); Pei-Ting Chou, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 1131 days.

(21) Appl. No.: 13/587,498

(22) Filed: Aug. 16, 2012

(65) Prior Publication Data
US 2014/0049260 A1    Feb. 20, 2014

(51) Int. Cl.
G01R 31/00    (2006.01)
G01R 31/26    (2014.01)
G01R 31/44    (2006.01)

(52) U.S. Cl.
CPC ........... G01R 31/2635 (2013.01); *G01R 31/44* (2013.01)

(58) Field of Classification Search
CPC .............. G01R 31/2635; G01R 1/0408; H01S 5/02208; H01L 2924/12041
USPC .............. 324/414, 762.08, 762.09, 410, 403, 324/500–555; 702/57, 130, 136, 60, 63, 702/82; 362/295
See application file for complete search history.

(56) References Cited

U.S. PATENT DOCUMENTS

| 7,952,368 B1 | 5/2011 | Dai et al. |
| 8,075,182 B2 | 12/2011 | Dai et al. |
| 2007/0132470 A1* | 6/2007 | Kamakura ............ H01S 5/0014 324/750.08 |
| 2011/0133769 A1* | 6/2011 | Chen .................. G01R 31/2635 324/762.07 |

FOREIGN PATENT DOCUMENTS

TW    I315399    5/2008

OTHER PUBLICATIONS

L.-R. Trevisanello et al., Thermal stability analysis of High Brightness LED during high temperature and electrical aging, Proc. of SPIE, 2007, pp. 13-1-13-10, vol. 6669.
Marta Rencz et al., Thermal Issues in Stacked Die Packages, 21$^{st}$ IEEE Semi-Therm Symposium, 2005, 6 pages.
(Continued)

*Primary Examiner* — Melissa Koval
*Assistant Examiner* — Trung Nguyen
(74) *Attorney, Agent, or Firm* — Muncy, Geissler, Olds & Lowe, P.C.

(57) ABSTRACT

The present disclosure relates to a method for measuring thermal electric characteristics of a semiconductor device, including the steps of: providing at least one current to the LED device over a time interval; recording a voltage transient response of the LED device, wherein the voltage transient response has a plurality of time segments different in gradient; computing a voltage difference from one of the plurality of time segments in the voltage transient response; and determining whether the LED device is defective based on the voltage difference, wherein the voltage difference is thermal dependent. The present disclosure also provides a testing method for defining a plurality of time segments.

19 Claims, 4 Drawing Sheets

(56) References Cited

OTHER PUBLICATIONS

Gordon Elger et al., Inline Thermal Transient Testing of High Power LED Modules for Solder Joint Quality Control, IEEE Electronic Components and Technology Conference, 2011, pp. 1649-1656.

Lianqiao Yang et al., Thermal analysis of high power GaN-based LEDs with ceramic package, ScienceDirect/Thermochimica Acta, 2007, pp. 95-99, vol. 455, Elsevier.

Wong Joon Hwang et al., Thermal Investigation of GaN-Based Laser Diode Package, IEEE Transactions of components and packaging technologies, Dec. 2007, pp. 637-642, vol. 30, No. 4.

\* cited by examiner

METHOD OF MEASURING THERMAL ELECTRIC CHARACTERISTICS OF SEMICONDUCTOR DEVICE

TECHNICAL FIELD

The present disclosure relates to semiconductor light emitting diode (LED) devices, and, more particularly, to a method for rapidly measuring thermal electric characteristics of a semiconductor LED device.

BACKGROUND

Nowadays light emitting diodes (LED) are widely used in a variety of applications, such as indicator lamps, general lighting, automotive lighting, and advertising. In addition, video displays and sensors are also to be developed by LED devices. With the development of LEDs, the devices are subject to junction temperatures and current densities. These tend to cause excessive thermal stresses on the material, and may cause light-output degradation as most of the inputted power is converted to heat. Under this circumstance, the LED light performance is very much affected by temperature.

In general, thermal testing of LED devices is to measure the temperature rise, so as to ensure that the maximum junction temperature is not exceeded. The thermal resistance is defined as a property of the junction temperature of an LED device. Consequently, the thermal resistance is a critical parameter for evaluating a heat dissipation performance of an LED device. The conventional thermal measurement methods of LED devices are similar to those of general IC chips. The conventional methods for measuring LED thermal characteristics include two steps. The conventional LED thermal measurement methods begin with the first step of measuring a temperature sensitive parameter (TSP). A heating current, such as 300 mA, is provided to an LED device by a current source, and a voltage meter is used for measuring a relation between a temperature and an output voltage. Subsequently, the heating current is switched to a small current, such as 1 mA. A forward voltage under the small current is measured as the calculation of the device temperature. These steps are repeated many times. Moreover, there are some other conventional LED thermal measurement technologies, which are used for measuring the thermal resistance. Overall, these conventional thermal measurement methods are usually complicated and very time-consuming, and these aforesaid methods for measuring the accurate thermal resistance are all restricted due to the TSP value measurement, requiring a steady-state testing condition. Therefore, these thermal measurement methods or approaches require a longer time to monitor temperature at equilibrium, and are not suitable for fast measurement of thermal resistances and thermal electric characteristics of LED devices under different temperatures.

Accordingly, it is necessary to provide a method for measuring a thermal characteristic and a chip temperature of an LED device in a fast manner.

The above-described deficiencies of today's LED thermal measurement are merely intended to provide an overview of some of the problems of the conventional methods, and are not intended to be exhaustive. Other problems with conventional methods and corresponding benefits of the various non-limiting embodiments described herein may become further apparent upon review of the following description.

SUMMARY

A summary is provided herein to help enable a basic or general understanding of various aspects of exemplary, non-limiting embodiments in conjunction with the following detailed description and the accompanying drawings. However, this summary is not intended as an extensive or exhaustive overview. Instead, the purpose of this summary is to present some concepts related to some exemplary, non-limiting embodiments in a simplified form as a prelude to the detailed description of the various embodiments as follow.

In one or more exemplary embodiments of the present disclosure, a method for rapidly measuring thermal electric characteristics of a light emitting diode (LED) device, comprising the steps of providing at least one current to the LED device over a time interval; recording a voltage transient response of the LED device, wherein the voltage transient response has a plurality of time segments different in gradient; computing a voltage difference from one of the plurality of time segments in the voltage transient response; and determining whether the LED device is defective based on the voltage difference, wherein the voltage difference is thermal dependent.

In one or more embodiments of the present disclosure, a testing method is used for determining and defining a plurality of time segments, and comprises the steps of recording each of a plurality of material layers of the LED device; providing at least one current to the LED device; recording a voltage transient response of the LED device; determining gradients of the voltage transient response; and defining a plurality of time segments based on the different gradients of the voltage transient response.

The scope of applicability of the present disclosure will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to persons skilled in the art from the following detailed description.

BRIEF DESCRIPTION OF DRAWINGS

The subject matter with regard to the present disclosure is particularly pointed out and distinctly claimed in the claims at the conclusion of the specification. The foregoing and other objects and features of the present disclosure will be understood by the following detailed description taken in conjunction with the accompanying drawings in which:

DETAILED DESCRIPTION

The following exemplary embodiments will be described fully with reference to the accompanying drawings. However, the present disclosure may be embodied in many different forms, and should be constructed but not limited to the exemplary embodiments set forth herein. Additionally, these embodiments are provided so that the present disclosure will be complete and thorough. Besides, these exemplary embodiments will plentifully convey the present disclosure to persons skilled in the art.

The present disclosure provides a method for rapidly measuring thermal electric characteristics of a semiconductor device, i.e., a light emitting diode (LED) device, so as to resolve time-consuming temperature measurement issues associated with LED devices.

In accordance with some aspects of the present disclosure, the LED device contains an LED die. The LED die is die-bonded on a package carrier. A package interface is formed between the LED die and the package carrier. The package interface includes thermal conductive adhesive, silver paste, eutectic ally, and so forth. Moreover, the LED device further contains a circuit board and an assembly interface. The package carrier is assembled on the circuit board, and the assembly interface is formed between the package carrier and the circuit board.

Figure 1:
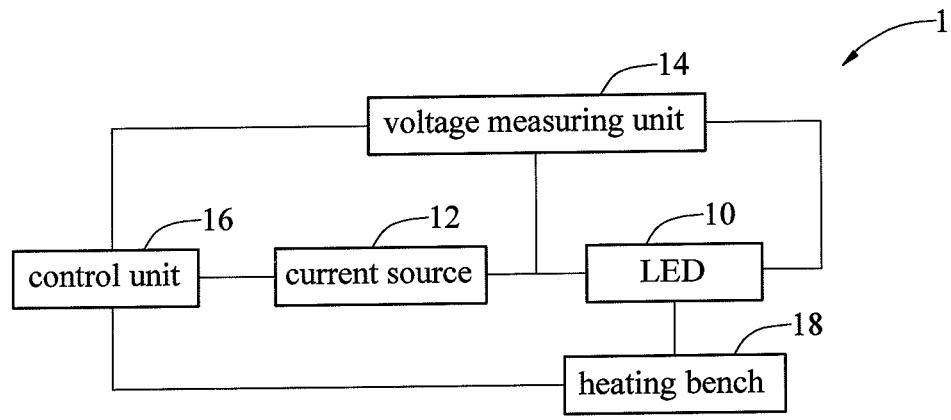
FIG. 1 shows a block diagram of an apparatus for performing a method of rapidly measuring thermal electric characteristics of an LED device in accordance with an exemplary embodiment of the present disclosure.

In order to clearly describe the method for rapidly measuring thermal electric characteristics of an LED device, an apparatus for performing the fast thermal measurement method of the present disclosure is described as follows. FIG. 1 shows a block diagram of the apparatus 1 for rapidly measuring thermal electric characteristics of an LED device 10 according to one embodiment of the present disclosure. Referring to FIG. 1, the apparatus 1 includes an LED device 10, a current source 12, a voltage measuring unit 14, a control unit 16, and a heating bench 18. In accordance with one exemplary embodiment, the LED device 10 is similar to the LED device described above.

Figure 2:
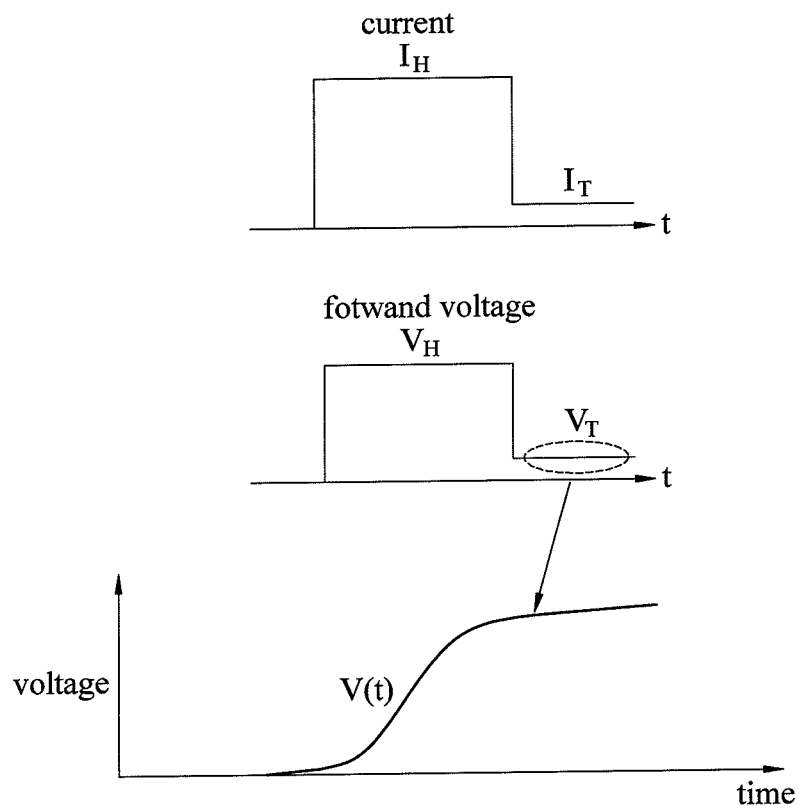
FIG. 2 shows a diagram of a relation between a current, a forward voltage and a voltage transient response in accordance with an exemplary embodiment of the present disclosure.

According to one exemplary embodiment of the present disclosure, referring to FIGS. 1 and 2, the control unit 16 provides a control signal to control the current source 12 for generating a heating current $I_H$ to the LED device 10. The temperature of the LED device 10 rises due to the heating current $I_H$ generally greater than 10 mA, as shown in FIG. 2. It is noted that the heating current $I_H$ can be adjusted based on the size of an LED device. When the heating current $I_H$ is switched to a testing current $I_T$, the temperature of the LED device 10 will be cooling down. The testing current $I_T$ is generally between 0.1 mA and 10 mA. In this exemplary embodiment, the control unit 16 provides a control signal to control the voltage measuring unit 14 for measuring a voltage transient response from heating up the LED device 10 under the heating current $I_H$ to cooling down the LED device 10 under the testing current $I_T$. In another exemplary embodiment, the voltage transient response can be measured from cooling down the LED device 10 under the testing current $I_T$ to heating up the LED device 10 under the heating current $I_H$. The voltage transient response associated with a forward voltage of the junction of the LED device 10 is temperature dependent. The forward voltage includes a forward heating voltage $V_H$ and a forward testing voltage $V_T$, and the forward heating voltage $V_H$ and the forward testing voltage $V_T$ are generated by the heating current $I_H$ and the testing current $I_T$, respectively. In addition, the LED device 10 is contacted by at least two electrical testing probe pins or a set of probe pins, and thus the voltage transient response associated with the forward voltage of the LED device 10 is measured by the voltage measuring unit 14 through the at least two electrical testing probe pins or the set of probe pins.

According to another exemplary embodiment, the control unit 16 provides a control signal to the heating bench 18, on which the LED device 10 is placed. The LED device 10 is heating up via the heating bench 18, and thus the temperature of the LED device 10 rises. In order to ensure that the temperature of the LED device 10 rises exactly, a heating interval is generally greater than 10 us, and a heating temperature is between 25° C. and 300° C. In this exemplary embodiment, the control unit 16 also provides a control signal to control the voltage measuring unit 14 for measuring a voltage transient response from heating up the LED device 10 under the heating condition to cooling down the LED device 10. In another exemplary embodiment, the voltage transient response can be measured from cooling down the LED device 10 to heating up the LED device 10 under the heating condition. The voltage transient response associated with a forward voltage of the junction of the LED device 10 is temperature dependent. Further, the LED device 10 is also contacted by at least two electrical testing probe pins or a set of probe pins, and thus the voltage transient response associated with the forward voltage of the LED device 10 is measured by the voltage measuring unit 14, which is controlled by the control unit 16, through the at least two electrical testing probe pins or the set of probe pins.

Figure 3:
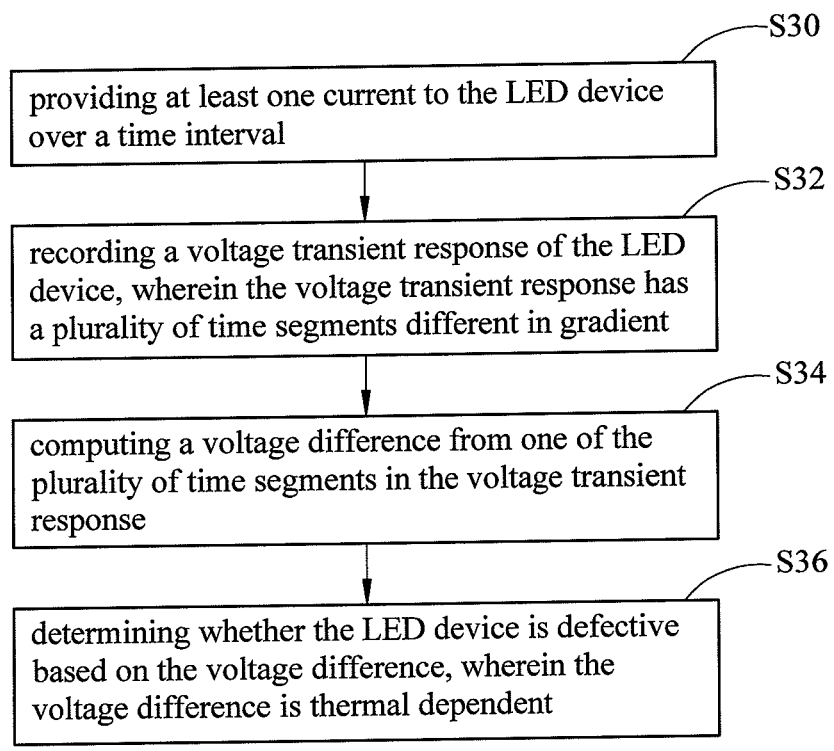
FIG. 3 shows a flowchart of the method for rapidly measuring thermal electric characteristics of an LED device in accordance with an exemplary embodiment of the present disclosure.

In one exemplary embodiment of the present disclosure, referring to FIG. 3, a flowchart of the method for measuring thermal electric characteristics of an LED device in a fast manner is shown. The method for rapidly measuring thermal electric characteristics of an LED device includes the following steps. The method begins with step S30 of providing at least one current to the LED device over a time interval. In step S32, a voltage transient response associated with a forward voltage of the LED device is recorded, wherein the voltage transient response has a plurality of time segments different in gradient. Subsequently, in step S34, a voltage difference from one of the plurality of time segments in the voltage transient response is computed. Afterwards, in step S36, whether the LED device is defective is determined based on the voltage difference that is thermal dependent. That is to say, according to one exemplary embodiment of the present disclosure, the voltage difference is proportional to the temperature difference, the thermal resistance and the junction temperature.

Figure 4:
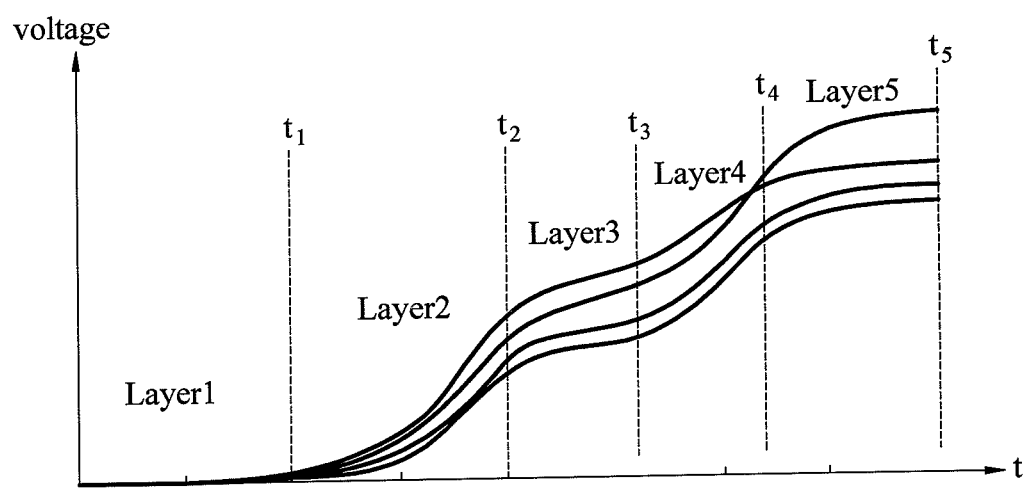
FIG. 4 shows a diagram of a voltage transient response associated with different LED devices over a plurality of time segments in accordance with an example of the present disclosure.

In an example of the present disclosure, FIG. 4 with regard to four different LED devices with an area of 1 mm², the initial gradient of the voltage transient response is close to zero, and then the gradient rises at time t1. It can be seen from FIG. 4 that the time interval between 0 and time t1 is the first layer temperature of the LED device. Moreover, the gradient will be changed again at time t2 by the temperature of the second layer of the LED device after time t1, and thus the time interval between time t1 and time t2 is the second layer temperature of the LED device. Afterwards, the gradient will be changed at time t3 by the temperature of the third layer of the LED device. As such, the time interval between time t2 and time t3 is the third layer temperature of the LED device. Similarly, the gradient will be changed at time t4 by the temperature of the fourth layer of the LED device, and the time interval between time t3 and time t4 is the fourth layer temperature of the LED device. Hence, the time interval between time t4 and time t5 is the fifth layer temperature of the LED device. Accordingly, a material layer is initially selected, and a voltage difference from one of the plurality of time segments in the voltage transient response is subsequently computed. Whether the LED device is defective is then determined based on the voltage difference.

Further, in accordance with one exemplary embodiment of the present disclosure, the method further includes the following steps for computing the voltage transient response. The voltage transient response over a time interval (e.g., from t1 to t2) can be further summed up, i.e., $$VS = \sum_{t1}^{t2} VF(t),$$

where VF(t) is the voltage transient response, VS is the voltage difference. In accordance with another exemplary embodiment of the present disclosure, the voltage transient response can be further computed by using the first derivative or higher derivatives and then summed up over a time interval (i.e., $$\left(i.e., VS = \sum_{t1}^{t2} \frac{d^{(n)} VF(t)}{dt^{(n)}}\right).$$

In accordance with an alternative exemplary embodiment of the present disclosure, the voltage transient response can be further computed by using higher derivatives and then computed by the definite integral (i.e., $VS=\int_{t1}^{t2} VF(t)dt$) or higher definite integrals over a time interval (i.e., $$\left(i.e., VS = \int_{t1}^{t2} \ldots \int_{t1}^{t2} \frac{d^{(n)} VF(t)}{dt^{(n)}} dt\right).$$

That is to say, the voltage transient response can be further computed and processed by way of using the first derivative, higher derivatives, a summation, the definite integral, higher definite integrals, or the combination thereof.

Additionally, in accordance with the above exemplary embodiment of the present disclosure, the thermal resistance can be differentiated by three grades (i.e., A, B and C). For example, grade A is less than 9 K/W; grade B is between 9 and 13 K/W; and grade C is greater than 13 K/W. It is noted that the grades of the thermal resistance can be modified according to different applications of the LED device in actual situations, and will not restrict the scope of the disclosure.

In accordance with some aspects, the at least one current is a heating current $I_H$ and a testing current $I_T$, and the heating current $I_H$ can be a forward direct current or a pulse heating current. Additionally, when a value of the heating current $I_H$ is greater than 10 mA, the temperature of the LED device rises, and when a value of the testing current $I_T$ is between 0.1 mA and 10 mA, a rise in temperature of the LED device is prevented. In other words, in an instance, when the heating current $I_H$ is switched to the testing current $I_T$, the temperature of the LED device 10 will be cooling down. In another instance, when the testing current $I_T$ is changed to the heating current $I_H$, the temperature of the LED device 10 will be heating up. Moreover, a switching time between the heating current $I_H$ and the testing current $I_T$ is within 300 us, preferably within 50 us. In accordance with one aspect, a heating interval is greater than 10 us, and a heating temperature is between 25° C. and 300° C.

In accordance with one exemplary embodiment of the present disclosure, the method further comprises the steps as follows. The voltage transient response measured by the voltage measuring unit 14 is transferred to a logarithm scale by using the logarithm, and the voltage transient response is obtained from a forward heating voltage $V_H$ of the LED device 10. In another exemplary embodiment, the voltage transient response can also be obtained from the a forward testing voltage $V_T$ of the LED device 10, of which the forward heating voltage $V_H$ and the forward testing voltage $V_T$ are generated by the heating current $I_H$ and the testing current $I_T$, respectively.

Moreover, in accordance with one exemplary embodiment of the present disclosure, the method further comprises the following steps. The voltage transient response over a time interval can be further summed up. In accordance with another exemplary embodiment of the present disclosure, the voltage transient response can be further computed by using the first derivative or higher derivatives and then summed up over a time interval. In accordance with an alternative exemplary embodiment of the present disclosure, the voltage transient response can be further computed by using higher derivatives and then computed by the definite integral or higher definite integrals over a time interval. That is to say, the voltage transient response can be further computed and processed by way of using the first derivative, higher derivatives, a summation, the definite integral, higher definite integrals, or the combination thereof.

By way of the above exemplary embodiments, the method of the present disclosure determines whether the LED device 10 is defective, based on the voltage difference value of the LED device 10. In other words, a threshold value of voltage difference can be set for determining whether the LED device 10 is defective or not. That is to say, the LED device 10 is determined defective if its voltage difference value is higher than the threshold value. Otherwise, the LED device 10 is determined non-defective. The threshold value of the voltage difference of the LED device 10 in the above embodiments, for example, is 0.019V. It is noted that the threshold value of the LED device 10 can be modified according to different applications of the LED device 10, and will not restrict the scope of the disclosure.

Furthermore, in one exemplary embodiment of the present disclosure, prior to using the method for rapidly measuring thermal electric characteristics of the LED device 10, a plurality of time segments representing various different layers of the LED device 10 are pre-defined by a testing method.

According to one exemplary embodiment of the testing method, an apparatus for performing the testing method of the present disclosure is provided and is similar to the apparatus 1 for performing the method of measuring thermal electric characteristics of an LED device. The apparatus for performing the testing method of the present disclosure includes an LED device, a current source, a voltage measuring unit, a control unit, and a heating bench. In accordance with one exemplary embodiment, the LED device is similar to the LED device 10 described above.

In accordance with one exemplary embodiment of the testing method, the control unit provides a control signal to control the current source for generating the heating current $I_H$ to the LED device. The temperature of the LED device rises since the heating current $I_H$ is greater than 10 mA, and when a value of the testing current $I_T$ is between 0.1 mA and 10 mA, a rise in temperature of the LED device is prevented. It is noted that the heating current $I_H$ can be adjusted based on the size of an LED devices. When the heating current $I_H$ is switched to a testing current $I_T$, the temperature of the LED device will be cooling down. In this exemplary embodiment, the control unit provides a control signal to control the voltage measuring unit for measuring a voltage transient response from heating up the LED device under the heating current $I_H$ to cooling down the LED device under the testing current $I_T$. In another exemplary embodiment, the voltage transient response can be measured from cooling down the LED device under the testing current $I_T$ to heating up the LED device under the heating current $I_H$. Hence, a switching time between the heating current $I_H$ and the testing current $I_T$ is within 300 us, preferably within 50 us, a heating interval is greater than 10 us, and a heating temperature is between 25° C. and 300° C.

The voltage transient response associated with a forward voltage of the junction of the LED device is temperature dependent. In addition, the LED device is contacted at least two electrical testing probe pins or a set of probe pins, and thus the voltage transient response associated with the forward voltage is measured by the voltage measuring unit through the at least two electrical testing probe pins or the set of probe pins.

In accordance with another exemplary embodiment of the testing method, the control unit provides the heating current to the heating bench, on which an LED device is placed. The LED device is heating up via the heating bench, and thus the temperature of the LED device rises. In order to ensure the temperature of the LED device an exact rise, a heating interval is greater than 10 us, and a heating temperature is between 25° C. and 300° C. In this exemplary embodiment, the control unit provides a control signal to control the voltage measuring unit for measuring a voltage transient response from heating up the LED device under the heating condition to cooling down the LED device. The voltage transient response associated with a forward voltage of the junction of the LED device is temperature dependent. Moreover, the LED device is also contacted by at least two electrical testing probe pins or a set of probe pins, and thus the voltage transient response associated with the forward voltage is measured by the voltage measuring unit through the at least two electrical testing probe pins or the set of probe pins.

Figure 5:
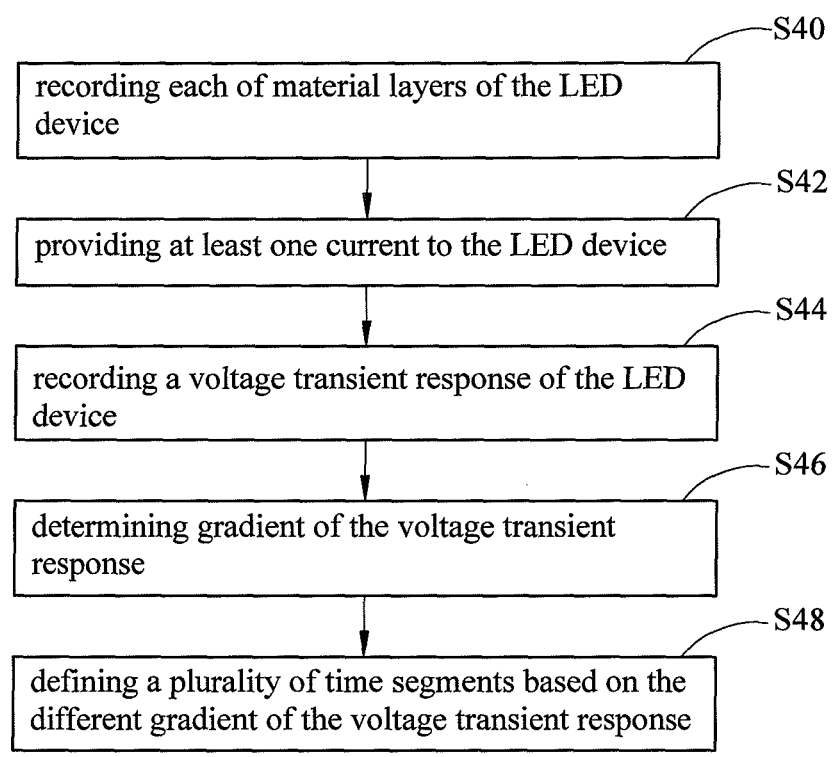
FIG. 5 shows a flowchart of a testing method for measuring thermal electric characteristics of a light emitting diode (LED) device in accordance with an exemplary embodiment of the present disclosure.

According to one exemplary embodiment, the present disclosure also provides a testing method for performing the method of measuring thermal electric characteristics of an LED device in a fast manner, as shown in FIG. 5. The testing method includes the steps as follows. The testing method begins with step S40 of recording each of material layers of the LED device. In step S42, at least one current is provided to the LED device. After the step S42, a voltage transient response associated with a forward voltage of the LED device is then measured and recorded in step S44. Subsequently, gradients of the voltage transient response are determined in step S46. In step S48, a plurality of time segments are defined based on the different gradients of the voltage transient response. Hence, the plurality of time segments, which are defined by the testing method, are utilized in the method for rapidly measuring thermal electric characteristics of an LED device of the present disclosure.

Once the plurality of time segments are determined and defined by the testing method, the method of rapidly measuring thermal electric characteristics of an LED device of the present disclosure is carried on in order to quickly determine the thermal performance status of LED devices.

The word "exemplary" is used herein to serve as an example, instance, or illustration. For the avoidance of doubt, the subject matter disclosed herein is not limited to such examples. Additionally, any aspect described herein as "exemplary" is not necessarily to be construed as preference over other aspects, nor is it meant to preclude equivalent exemplary structures and techniques which are known to persons skilled in the art. Furthermore, to the extent that the terms "include," "contain" and other similar words are used, for the avoidance of doubt, such terms are intended to be inclusive in a manner similar to the term "comprise" as an open transition word without precluding any additional or other elements.

In view of the exemplary embodiments described above, methodologies that may be implemented in accordance with the described subject matter can also be appreciated with reference to the flowcharts of the various figures. For purposes of simplicity of explanation, the methodologies are shown and described as a series of blocks, it is to be appreciated that the various embodiments are not limited to the order of the blocks, as some blocks may occur in different orders and/or concurrently with other blocks from what is depicted and described herein. Although the flow of methodologies is illustrated via a flowchart, it can be appreciated that flow paths and orders of the blocks may be implemented to achieve the same or a similar result. Moreover, not all the illustrated blocks may be required to implement the methodologies described herein.

In addition to the various embodiments described herein, it is to be understood that other similar embodiments can be used, or additions and modifications can be made to the various embodiments for performing the same or equivalent function of the corresponding embodiments without deviating therefrom. Accordingly, the present disclosure should not be limited to any single embodiment, but rather should be construed in breadth, spirit and scope according to the appended claims.

What is claimed is:

1. A method for measuring thermal electric characteristics of a light emitting diode (LED) device, comprising the steps of:
   providing at least one current to the LED device over a time interval;
   recording a voltage transient response of the LED device, wherein the voltage transient response has a plurality of time segments different in gradient;
   computing a voltage difference from one of the plurality of time segments in the voltage transient response;
   transferring the voltage transient response to a logarithm scale by using the logarithm, and obtaining the voltage transient response from a heating voltage or a testing voltage of the LED device, wherein the heating voltage and the testing voltage are generated by a heating current and a testing current, respectively;
   summing up the voltage transient response over a time interval; and
   determining whether the LED device is defective based on the voltage difference, wherein the voltage difference is thermal dependent.

2. The method of claim 1, wherein the at least one current is the heating current and the testing current, and the heating current is a forward direct current or a pulse heating current.

3. The method of claim 2, wherein when a value of the heating current is greater than 10 mA, the temperature of the LED device rises, and when a value of the testing current is between 0.1 mA and 10 mA, a rise in temperature of the LED device is prevented.

4. The method of claim 2, wherein a switching time between the heating current and the testing current is within 300 us, a heating interval is greater than 10 us, and a heating temperature is between 25° C. and 300° C.

5. The method of claim 1, wherein the at least one current is the heating current, a control unit provides a control signal to control a current source for generating the heating current to the LED device, and the control unit provides a control signal to control the voltage measuring unit for measuring the voltage transient response.

6. The method of claim 1, wherein the at least one current is the heating current, a control unit provides the heating current to the heating bench, on which the LED device is placed, and the control unit provides a control signal to control the voltage measuring unit for measuring the voltage transient response.

7. The method of claim 1, wherein the LED device comprises an LED die, a package carrier and a package interface formed between the LED die and the package carrier.

8. The method of claim 7, wherein the LED device further comprises a circuit board and an assembly interface formed between the package carrier and the circuit board.

9. The method of claim 1, wherein the LED device is contacted and measured by at least two electrical testing probe pins or a set of probe pins.

10. A testing method for measuring thermal electric characteristics of a light emitting diode (LED) device, comprising the steps of:
   recording a voltage of each of a plurality of material layers of the LED device;
   providing at least one current to the LED device;
   recording a voltage transient response of the LED device;
   transferring the voltage transient response to a logarithm scale by using the logarithm, and obtaining the voltage transient response from a heating voltage or a testing voltage of the LED device, wherein the heating voltage and the testing voltage are generated by a heating current and a testing current, respectively;
   summing up the voltage transient response over a time interval;
   determining gradients of the voltage transient response; and
   defining a plurality of time segments based on the different gradients of the voltage transient response.

11. The testing method of claim 10, wherein the at least one current is the heating current and the testing current, and the heating current is a forward direct current or a pulse heating current.

12. The testing method of claim 11, wherein when a value of the heating current is greater than 10 mA, the temperature of the LED device rises, and when a value of the testing current is between 0.1 mA and 10 mA, a rise in temperature of the LED device is prevented.

13. The testing method of claim 11, wherein a switching time between the heating current and the testing current is within 300 us, a heating interval is greater than 10 us, and a heating temperature is between 25° C. and 300° C.

14. The testing method of claim 10, wherein the at least one current is the heating current, a control unit provides a control signal to control a current source for generating the heating current to the LED device, and the control unit provides a control signal to control the voltage measuring unit for measuring the voltage transient response.

15. The testing method of claim 10, wherein the at least one current is the heating current, a control unit provides the heating current to the heating bench, on which the LED device is placed, and the control unit provides a control signal to control the voltage measuring unit for measuring the voltage transient response.

16. The testing method of claim 10, wherein the LED device comprises an LED die, a package carrier and a package interface formed between the LED die and the package carrier.

17. The testing method of claim 10, wherein the LED device further comprises a circuit board and an assembly interface formed between the package carrier and the circuit board.

18. The testing method of claim 10, wherein the LED device is contacted and measured by at least two electrical testing probe pins or a set of probe pins.

19. A method for measuring thermal electric characteristics of a light emitting diode (LED) device, comprising the steps of:
   providing at least one current to the LED device over a time interval;
   recording a voltage transient response of the LED device, wherein the voltage transient response has a plurality of time segments different in gradient;
   computing a voltage difference from one of the plurality of time segments in the voltage transient response;
   transferring the voltage transient response to a logarithm scale by using the logarithm, and obtaining the voltage transient response from a heating voltage or a testing voltage of the LED device, wherein the heating voltage and the testing voltage are generated by a heating current and a testing current, respectively;
   summing up the voltage transient response over a time interval;
   computing and processing the voltage transient response by using the first derivative, higher derivatives, the definite integral, higher definite integrals, or the combination thereof over a time interval; and
   determining whether the LED device is defective based on the voltage difference, wherein the voltage difference is thermal dependent.

* * * * *